(12) United States Patent
Yang et al.

(10) Patent No.: US 9,381,599 B2
(45) Date of Patent: Jul. 5, 2016

(54) MANUFACTURING METHOD OF HEAT DISSIPATION ASSEMBLY

(71) Applicant: Quanta Computer Inc., Taoyuan Shien (TW)

(72) Inventors: Chi-Hsueh Yang, Keelung (TW); Ming-Chang Tsai, Taipei (TW); Wei-Han Chen, New Taipei (TW); Hsiao-Fan Chang, New Taipei (TW)

(73) Assignee: QUANTA COMPUTER INC., Guishan Dist., Taoyuan (TW)

( * ) Notice: Subject to any disclaimer, the term of this patent is extended or adjusted under 35 U.S.C. 154(b) by 193 days.

(21) Appl. No.: 14/279,610

(22) Filed: May 16, 2014

(65) Prior Publication Data

US 2015/0165572 A1 Jun. 18, 2015

(30) Foreign Application Priority Data

Dec. 17, 2013 (TW) .............................. 102146678 A (51) Int. Cl.
*B23P 15/26* (2006.01)
*F28D 15/02* (2006.01)
*F28D 15/04* (2006.01)
*H01L 23/427* (2006.01)
*H01L 21/48* (2006.01)

(52) U.S. Cl.
CPC .............. *B23P 15/26* (2013.01); *F28D 15/0233* (2013.01); *F28D 15/0275* (2013.01); *F28D 15/04* (2013.01); *H01L 23/427* (2013.01); *B23P 2700/09* (2013.01); *H01L 21/4882* (2013.01); *H01L 2924/0002* (2013.01); *Y10T 29/49353* (2015.01)

(58) Field of Classification Search
CPC ............ F28D 15/0233; F28D 15/0275; Y10T 29/49353; Y10T 29/49915; Y10T 29/49917; B23P 15/26; B23P 2700/09; H01L 23/427; H01L 21/4882; H01L 33/648
See application file for complete search history.

(56) References Cited

U.S. PATENT DOCUMENTS

| 4,045,653 A | * | 8/1977 | Soper | ..................... A47J 37/105 219/438 |
| 4,052,590 A | * | 10/1977 | Anderl | ................... A47J 27/004 165/171 |
| 4,880,052 A | * | 11/1989 | Meyer, IV | ........... F28D 15/0233 165/104.14 |

(Continued)

*Primary Examiner* — Jason L Vaughan
(74) *Attorney, Agent, or Firm* — Rabin & Berdo, P.C.

(57) ABSTRACT

A manufacturing method of a heat dissipation assembly includes the following steps: an accommodating concave portion and hollow areas are formed on a board body, and the hollow areas are through the board body located in the accommodating concave portion. The board body located in the accommodating concave portion is extended, such that the hollow areas are closed by the board body adjacent to the hollow areas. A heat pipe is placed in the accommodating concave portion, and the width of the heat pipe and the width of the accommodating concave portion are substantially the same. A stamping treatment is performed on the board body surrounding the accommodating concave portion to form positioning protruding portions, and the positioning protruding portions protrude toward the accommodating concave portion, such that the heat pipe is fixed between the positioning protruding portions and the accommodating concave portion.

9 Claims, 9 Drawing Sheets

(56) References Cited

U.S. PATENT DOCUMENTS

| | | | | |
|---|---|---|---|---|
| 5,329,686 A * | 7/1994 | Kildal | ............. | B29C 65/568 264/249 |
| 7,950,445 B2 * | 5/2011 | Cheng | ............. | F28D 15/0275 165/104.33 |
| 8,136,245 B2 * | 3/2012 | Lin | ............. | F28D 15/0275 29/890.032 |
| 8,286,693 B2 * | 10/2012 | Whitney | ............. | B21D 53/02 165/104.21 |
| 2006/0108104 A1 * | 5/2006 | Li | ............. | F28D 15/0275 165/104.33 |
| 2009/0294114 A1 * | 12/2009 | Yang | ............. | F28D 15/0266 165/185 |
| 2011/0290449 A1 * | 12/2011 | Huang | ............. | F28D 15/0275 165/104.26 |
| 2012/0216991 A1 * | 8/2012 | Chen | ............. | B23P 11/005 165/104.21 |
| 2012/0312508 A1 * | 12/2012 | Shen | ............. | F28D 15/0275 165/104.26 |

* cited by examiner

MANUFACTURING METHOD OF HEAT DISSIPATION ASSEMBLY

RELATED APPLICATIONS

This application claims priority to Taiwan Application Serial Number 102146678, filed Dec. 17, 2013, which is herein incorporated by reference.

BACKGROUND

1. Field of Invention

The present invention relates to a manufacturing method of a heat dissipation assembly.

2. Description of Related Art

In operation, electric elements of a computer, such as central processing units (CPU), south bridge chips, north bridge chips, display chips, etc., would generate heat. The chips consume less and less electricity along with the progress in semiconductor manufacturing process. Therefore, fan modules may not be necessary anymore as heat dissipation modules, which saves case space and to reduce operation noise. Instead, heat spreading materials or assemblies that have heat pipes and metal boards are utilized as heat dissipation modules.

The heat spreading material may be graphite material, copper foil, aluminum foil, or composite material. Although the heat spreading material requires less space, the heat spreading material has disadvantages of high cost and low heat dissipation capacity. In the manufacture of the assembly having the heat pipe and the metal board, soldering process is usually applied to fix the heat pipe on the metal board. The metal board needs to be in advance processed by CNC cutting process and stamping process to form a concave portion for accommodating the heat pipe. Next, the heat pipe can be placed in the concave portion of the metal board, and the heat pipe and the metal board may be soldered.

When an end of the heat pipe is located at a high temperature position and another end of the heat pipe at a low temperature position, working liquid fluid adsorbed by capillary bodies at the high temperature position would start to evaporate. The evaporated gas gathers in the space of the pipe and becomes gaseous fluid flowing to the low temperature position of the heat pipe due to pressure. When the gaseous fluid flows to the low temperature position, the gaseous fluid starts to condense back into liquid fluid, and the liquid fluid is adsorbed by capillary bodies at the low temperature position. Finally, the liquid fluid returns to the high temperature position from the low temperature position by the capillary phenomena of the capillary bodies. The working fluid continuously circulates to transfer heat by utilizing gas-liquid phase transformation.

There are some disadvantages in conventional art for manufacturing the assembly having the heat pipe and the metal board. For example, it is required to use at least three processes (including stamping, CNC cutting, and soldering) to assemble the heat pipe and the metal board, so that the labor cost and the process cost are increased. Moreover, when the multiple processes are involved, not only the entire yield rate decreases, but the CNC cutting process and the soldering process would reduce the mechanical strength of the heat pipe and the metal board.

SUMMARY

An aspect of the present invention is to provide a manufacturing method of a heat dissipation assembly.

According to an embodiment of the present invention, a manufacturing method of a heat dissipation assembly includes the following steps: (a) an accommodating concave portion and hollow areas are formed on a board body, and the hollow areas are through the board body located in the accommodating concave portion. (b) The board body located in the accommodating concave portion is extended, such that the hollow areas are closed by the board body adjacent to the hollow areas. (c) A heat pipe is placed in the accommodating concave portion, and the width of the heat pipe and the width of the accommodating concave portion are substantially the same. (d) A stamping treatment is performed on the board body surrounding the accommodating concave portion to form positioning protruding portions, and the positioning protruding portions protrude toward the accommodating concave portion, such that the heat pipe is fixed between the positioning protruding portions and the accommodating concave portion.

In one embodiment of the present invention, the manufacturing method of the heat dissipation assembly further includes: a heat conduction glue is coated on the heat pipe or the board body located in the accommodating concave portion, such that the heat conduction glue is between the heat pipe and the board body.

In one embodiment of the present invention, the manufacturing method of the heat dissipation assembly further includes: a rolling treatment is performed on the heat pipe to flat a surface of the heat pipe and to reduce a thickness of the heat pipe.

In one embodiment of the present invention, a thickness of the heat pipe is greater than a depth of the accommodating concave portion, such that the heat pipe is abutted against the positioning protruding portions.

In one embodiment of the present invention, step (a) includes: a stamping treatment is performed on the board body, such that the accommodating concave portion and the hollow areas are formed in the board body.

In one embodiment of the present invention, step (b) includes: a forging treatment is performed on the board body located in the accommodating concave portion, such that the hollow areas are closed by the board body located in the accommodating concave portion.

In one embodiment of the present invention, performing the forging treatment is at room temperature in a range from 0 to 40° C.

In one embodiment of the present invention, performing the stamping treatment in step (d) is at room temperature in a range from 0 to 40° C.

In one embodiment of the present invention, a lengthwise direction of each of the positioning protruding portions is the same as a lengthwise direction of the heat pipe.

In one embodiment of the present invention, the board body is made of a material comprising aluminum or copper.

In the aforementioned embodiments of the present invention, after the heat pipe is placed in the accommodating concave portion, the stamping treatment is performed on the board body surrounding the accommodating concave portion. As a result, the positioning protruding portions protruding toward the accommodating concave portion may be formed on the board body adjacent to the heat pipe and the accommodating concave portion, such that the heat pipe is fixed between the positioning protruding portions and the accommodating concave portion. The manufacturing method of the heat dissipation assembly of the present invention is simply used to assemble the heat pipe and the board body without performing CNC cutting process and soldering process. Moreover, since the manufacturing method does not include CNC cutting process and soldering process, the yield rate of the heat dissipation assembly having the heat pipe and the board body may be increased, and the mechanical strength of the heat dissipation assembly may be improved.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

Figure 1:
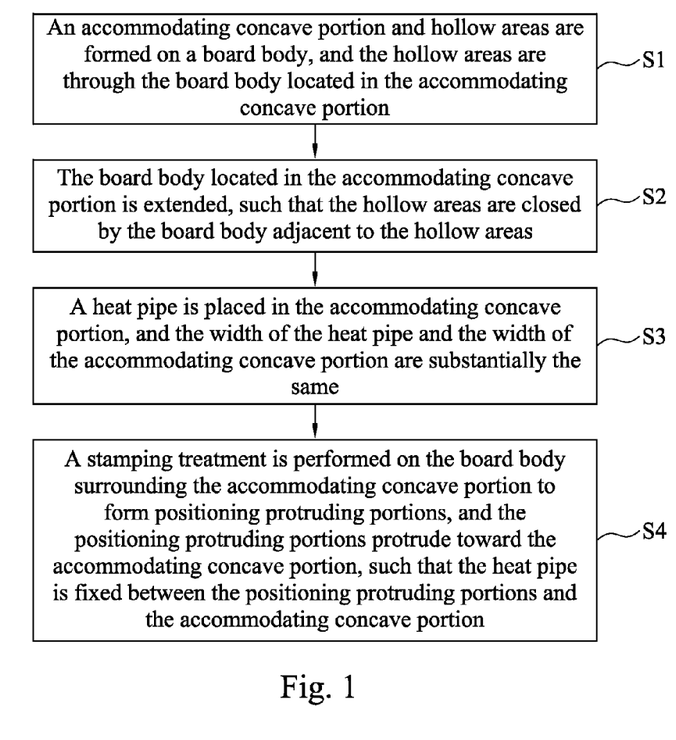
FIG. 1 is a flow chart of a manufacturing method of a heat dissipation assembly according to an embodiment of the present invention.

FIG. 1 is a flow chart of a manufacturing method of a heat dissipation assembly according to an embodiment of the present invention. The manufacturing method of the heat dissipation assembly includes the following steps. In step S1, an accommodating concave portion and hollow areas are formed on a board body, and the hollow areas are through the board body located in the accommodating concave portion. Next in step S2, the board body located in the accommodating concave portion is extended, such that the hollow areas are closed by the board body adjacent to the hollow areas. Thereafter in step S3, a heat pipe is placed in the accommodating concave portion, and the width of the heat pipe and the width of the accommodating concave portion are substantially the same. Finally in step S4, a stamping treatment is performed on the board body surrounding the accommodating concave portion to form positioning protruding portions, and the positioning protruding portions protrude toward the accommodating concave portion, such that the heat pipe is fixed between the positioning protruding portions and the accommodating concave portion.

In the following description, the aforesaid steps will be described.

Figure 2:
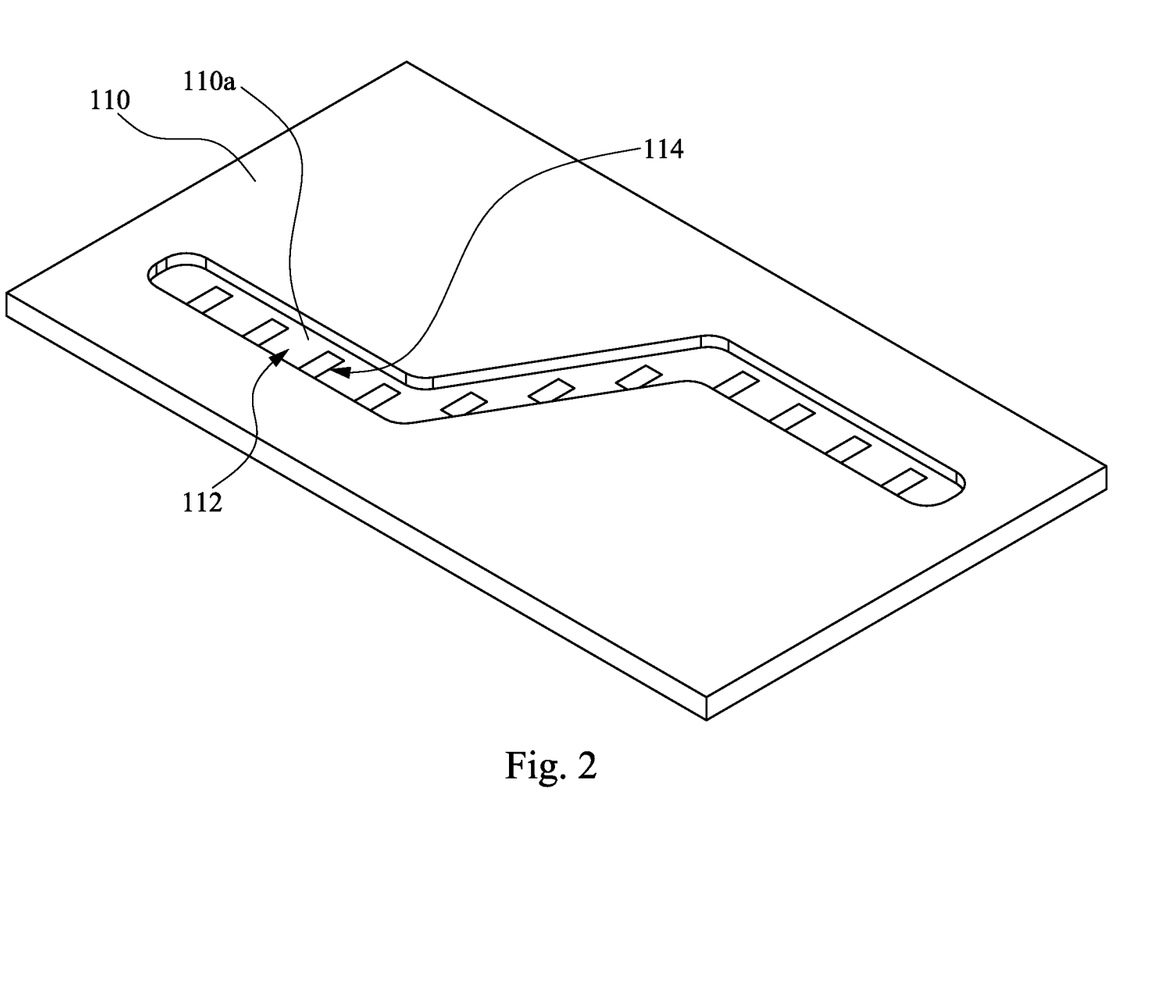
FIG. 2 is a perspective view of a board body according to an embodiment of the present invention when being formed an accommodating concave portion and hollow areas.
Figure 3:
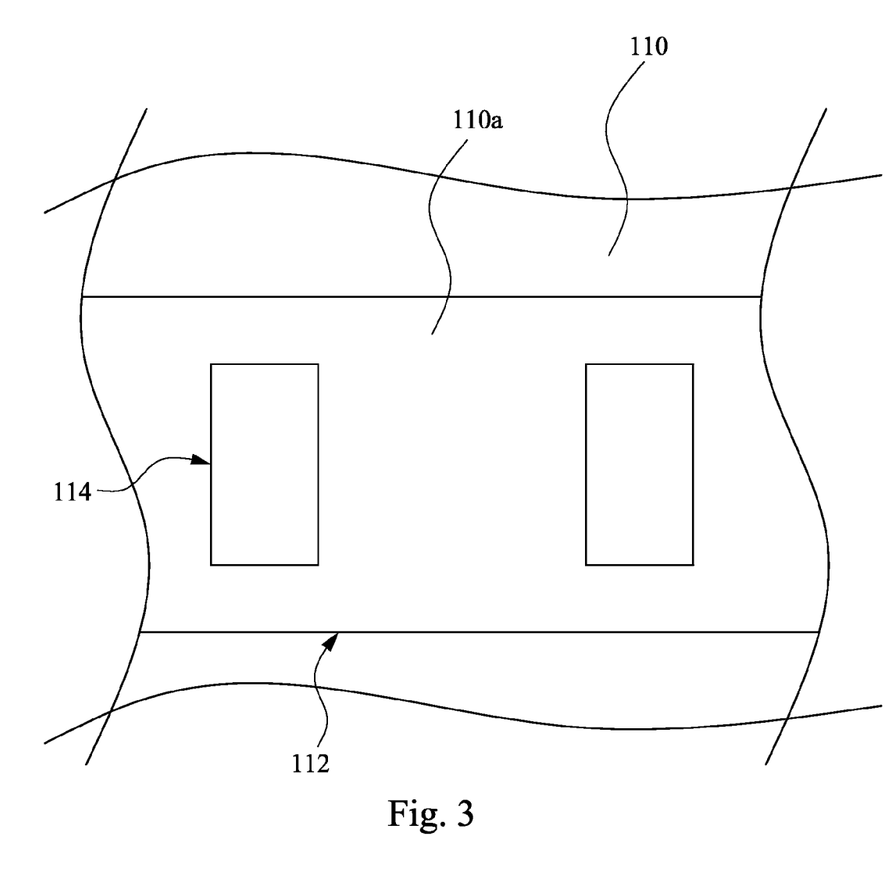
FIG. 3 is a partial enlarged top view of the accommodating concave portion and the hollow areas shown in FIG. 2.

FIG. 2 is a perspective view of a board body 110 according to an embodiment of the present invention when being formed an accommodating concave portion 112 and hollow areas 114. FIG. 3 is a partial enlarged top view of the accommodating concave portion 112 and the hollow areas 114 shown in FIG. 2. As shown in FIG. 2 and FIG. 3, the stamping treatment may be performed on the board body 110, such that the accommodating concave portion 112 and the hollow areas 114 are formed in the board body 110. The hollow areas 114 are through the board body 100a that is located in the accommodating concave portion 112. The accommodating concave portion 112 may be used to accommodate a heat dissipation element, such as a heat pipe 120 (see FIG. 6). Designers may form the accommodating concave portion 112 with a shape corresponding to the shape of the heat pipe 120 by stamping the board body 110, and the shape of the board body 110 is not limited as shown in FIG. 2.

Figure 4:
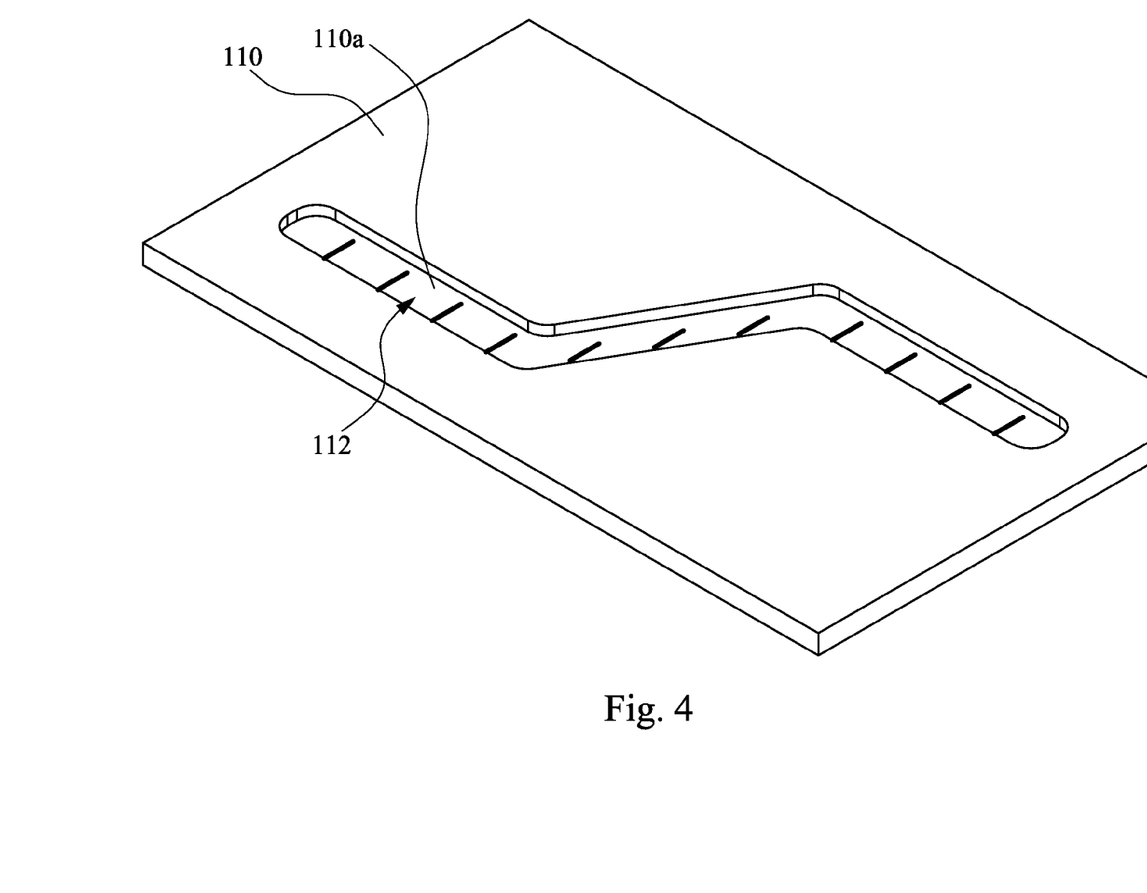
FIG. 4 is a perspective view of the hollow areas shown in FIG. 2 when being closed.
Figure 5:
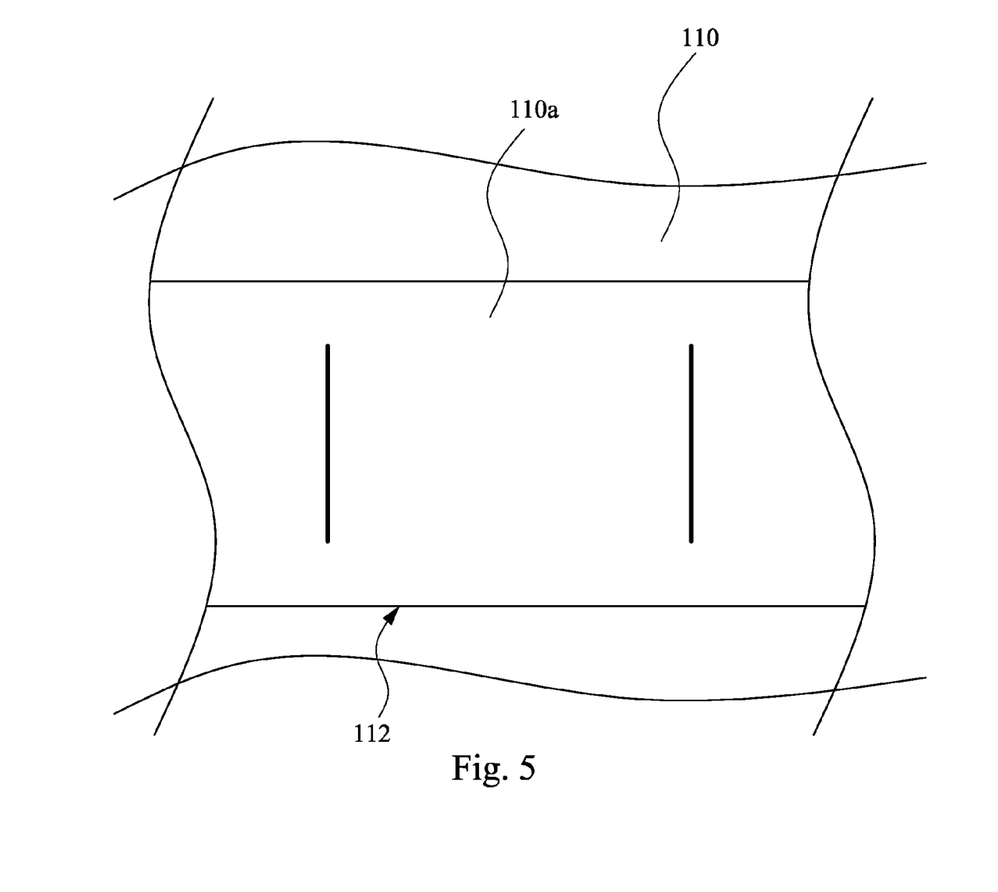
FIG. 5 is a partial enlarged top view of the accommodating concave portion shown in FIG. 4.

FIG. 4 is a perspective view of the hollow areas 114 shown in FIG. 2 when being closed. FIG. 5 is a partial enlarged top view of the accommodating concave portion 112 shown in FIG. 4. As shown in FIG. 4 and FIG. 5, after the hollow areas 114 are formed (see FIG. 3), the board body 110a located in the accommodating concave portion 112 may be extended, such that the hollow areas 114 are closed by the board body 110a that is adjacent to the hollow areas 114. In order to extend the board body 110a located in the accommodating concave portion 112, a forging treatment may be performed on the board body 110a. When the board body 110a adjacent to the hollow areas 114 is extended by the forging treatment, the area of the board body 110a may be increased to close the hollow areas 114. As a result, compared with the board body 110a having the open hollow areas 114 shown in FIGS. 2 and 3, when the heat pipe 120 (see FIG. 6) is assembled to the accommodating concave portion 112, the board body 110a having the closed hollow areas shown in FIGS. 4 and 5 may provide better thermal conductivity and support to the heat pipe 120 due to larger contact area between the board body 110a and the heat pipe 120.

In this embodiment, the board body 110 may be made of a material that includes aluminum or copper, but the present invention is not limited in this regard. As long as a metal with extensibility selected to manufacture the board body 110 is not broken during the stamping treatment and the forging treatment. Moreover, performing the stamping treatment and the forging treatment on the board body 110 may be at room temperature, such as in a range from 0 to 40° C. The manufacturing method does not include CNC cutting process or heating process, so the manufacturing cost may be reduced, and the mechanical strength of the board body 110 may be improved. The forging treatment at room temperature state may be referred to as cold-forging treatment.

Figure 6:
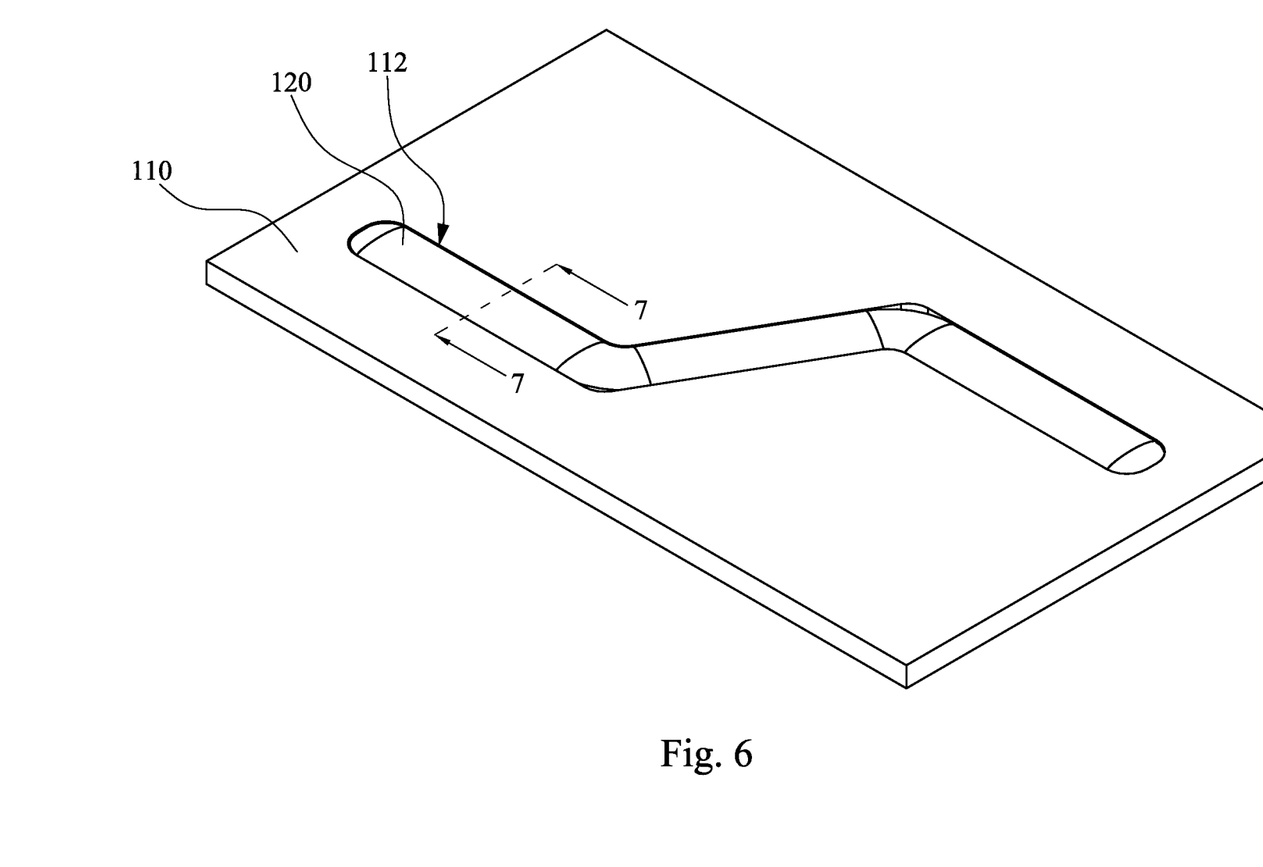
FIG. 6 is a perspective view of the accommodating concave portion shown in FIG. 4 when being placed a heat pipe.
Figure 7:
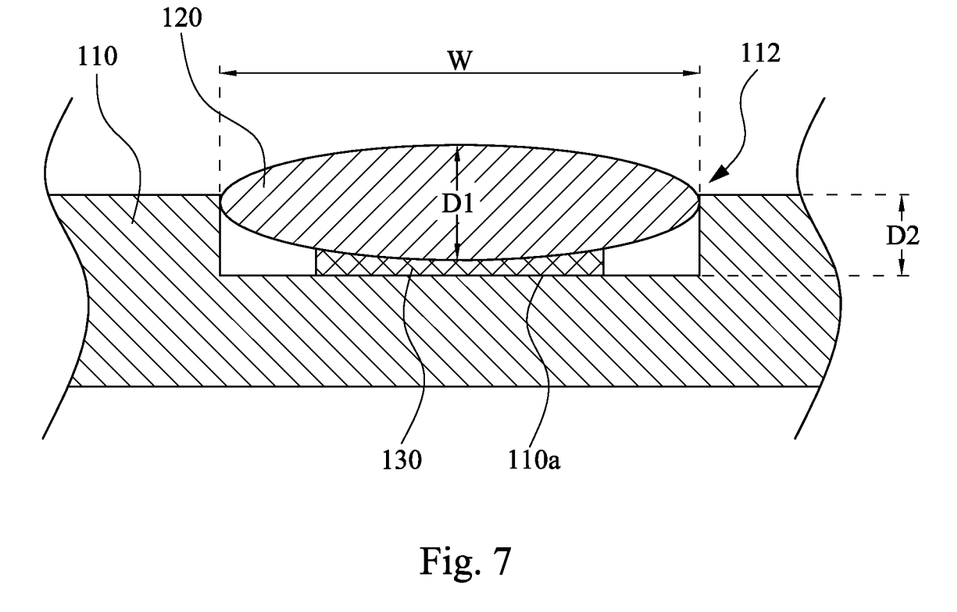
FIG. 7 is a cross-sectional view of the heat pipe and the board body taken along line 7-7 shown in FIG. 6.

FIG. 6 is a perspective view of the accommodating concave portion 112 shown in FIG. 4 when being placed the heat pipe 120. FIG. 7 is a cross-sectional view of the heat pipe 120 and the board body 110 taken along line 7-7 shown in FIG. 6. As shown in FIG. 6 and FIG. 7, in this embodiment, the width of the heat pipe 120 and the width of the accommodating concave portion 112 are substantially the same, such as the width W. As a result, when the heat pipe 120 is placed in the accommodating concave portion 112, the heat pipe 120 may be substantially positioned by the accommodating concave portion 112, such that the heat pipe 120 does not move in the accommodating concave portion 112.

When the heat pipe 120 has not been placed in the accommodating concave portion 112 yet, a rolling treatment may be performed on the heat pipe 120 to flat the surface of the heat pipe 120 and to reduce the thickness D1 of the heat pipe 120, thereby preventing the heat pipe 120 from protruding the accommodating concave portion 112 too much to occupy the space of a system (not shown). For example, the depth D2 of the accommodating concave portion 112 of the board body 110 may be 0.5 mm. When the rolling treatment has not been performed on the heat pipe 120, the thickness D1 may be 1.0 mm. If the heat pipe 120 not passing the rolling treatment is assembled to the accommodating concave portion 112, 0.5 mm thickness of the heat pipe 120 would protrude from the accommodating concave portion 112. However, after the rolling treatment is performed on the heat pipe 120, the thickness D1 may be reduced to 0.8 mm from 1.0 mm. As a result, when the heat pipe 120 passing the rolling treatment is assembled to the accommodating concave portion 112, only 0.3 mm thickness of the heat pipe 120 would protrude from the accommodating concave portion 112. The present invention is not limited by the thickness D1 of the heat pipe 120 and the depth D2 of the accommodating concave portion 112.

In this embodiment, before the heat pipe 120 is placed in the accommodating concave portion 112, a heat conduction glue 130 may be coated on the heat pipe 120 or the board body 110a that is located in the accommodating concave portion 112. As a result, after the heat pipe 120 is placed in the accommodating concave portion 112, the heat conduction glue 130 may be between the heat pipe 120 and the board body 110a. The heat conduction glue 130 is used to fill a gap between the heat pipe 120 and the board body 110a for improving heat conduction efficiency.

Figure 8:
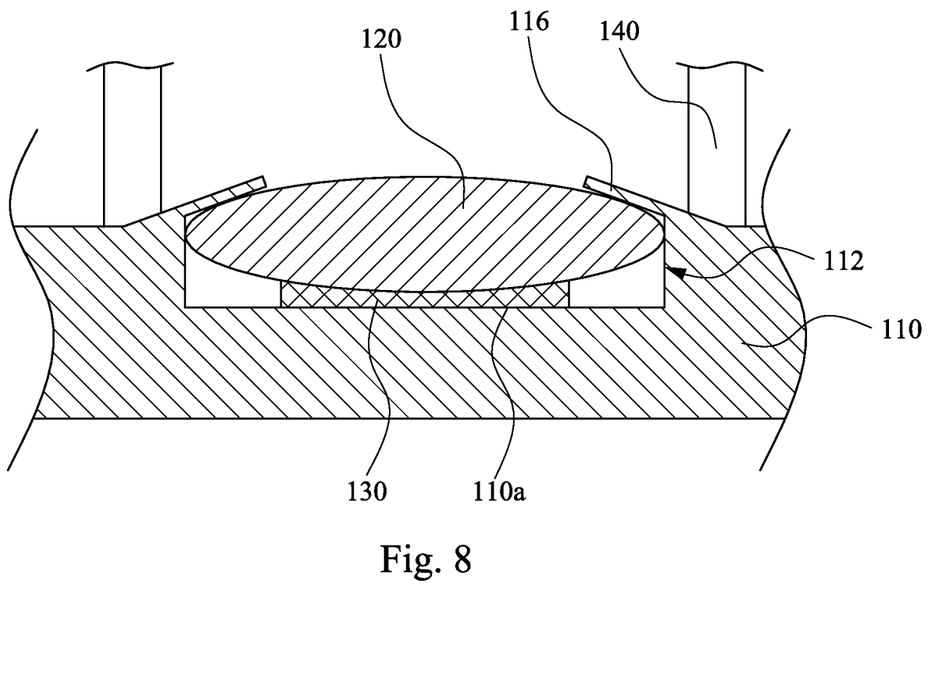
FIG. 8 is a schematic view of the board body shown in FIG. 7 when being stamped by a punch.

FIG. 8 is a schematic view of the board body 110 shown in FIG. 7 when being stamped by a punch 140. As shown in FIG. 7 and FIG. 8, when the heat pipe 120 is placed in the accommodating concave portion 112, the thickness D1 of the heat pipe 120 may be greater than the depth D2 of the accommodating concave portion 112. Thereafter, a stamping treatment may be performed on the board body 110 that surrounds the accommodating concave portion 112 to form positioning protruding portions 116. The contact position of the board body 110 the punch 140 is adjacent to the accommodating concave portion 112, so that the positioning protruding portions 116 protrude toward the accommodating concave portion 112. Moreover, the thickness D1 of the heat pipe 120 is greater than the depth D2 of the accommodating concave portion 112. Therefore, when the positioning protruding portions 116 are formed, the heat pipe 120 can be abutted against the positioning protruding portions 116, and the heat pipe 120 is fixed between the positioning protruding portions 116 and the accommodating concave portion 112.

In this embodiment, the stamping treatment for the board body 110 may be at room temperature that is in a range from 0 to 40° C.

Figure 9:
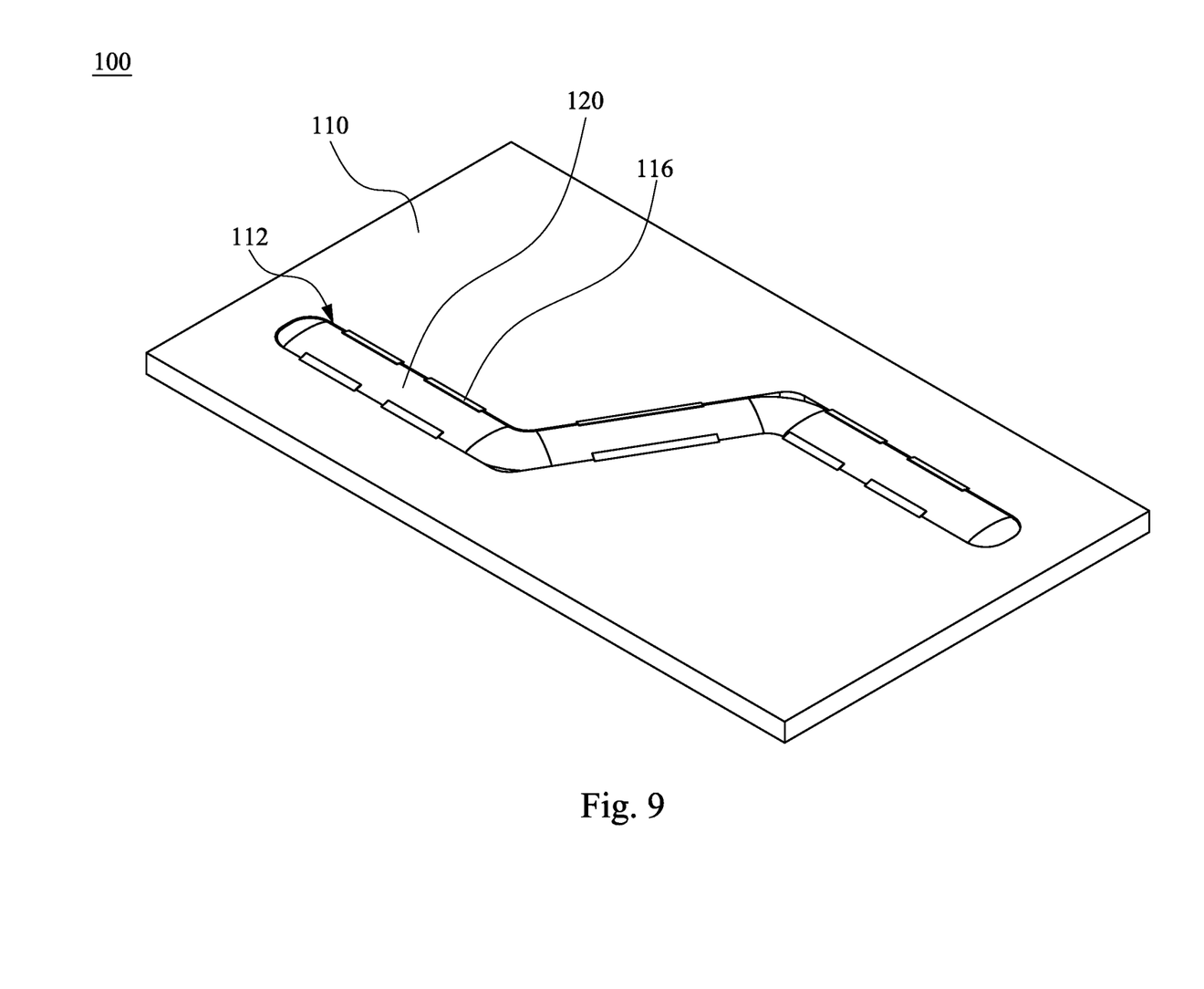
FIG. 9 is a perspective view of the heat pipe and the board body shown in FIG. 8 after positioning protruding portions are formed.

FIG. 9 is a perspective view of the heat pipe 120 and the board body 110 shown in FIG. 8 after the positioning protruding portions 116 are formed. As shown in FIG. 8 and FIG. 9, after the board body 110 surrounding the accommodating concave portion 112 forms the positioning protruding portions 116, the punch 140 leaves the board body 110, such that the board body 110 having the positioning protruding portions 116 are produced. The heat dissipation assembly 100 includes the heat pipe 120 and the board body 110 having the accommodating concave portion 112 and the positioning protruding portions 116. The heat dissipation assembly 100 does need to pass CNC cutting process and the soldering process to assemble the heat pipe 120 and the board body 110, so that the labor cost and the process cost may be reduced. Moreover, since the manufacturing method does not include CNC cutting process and soldering process, the yield rate of the heat dissipation assembly 100 having the heat pipe 120 and the board body 110 may be increased, and the mechanical strength of the heat dissipation assembly 100 may be improved.

In this embodiment, the lengthwise direction of each of the positioning protruding portions 116 is the same as the lengthwise direction of the heat pipe 120, and the positioning protruding portions 116 are formed with intervals at two opposite sides of the accommodating concave portion 112. As a result, when the heat pipe 120 receives a temperature of a heat source to thermally expand and contract, the downward pressure of the positioning protruding portions 116 for the heat pipe 120 may be more uniform.

Compared with the manufacturing method of the heat dissipation assembly and the prior art, after the heat pipe is placed in the accommodating concave portion, the stamping treatment is performed on the board body surrounding the accommodating concave portion. As a result, the positioning protruding portions protruding toward the accommodating concave portion may be formed on the board body adjacent to the heat pipe and the accommodating concave portion, such that the heat pipe is fixed between the positioning protruding portions and the accommodating concave portion. The manufacturing method of the heat dissipation assembly of the present invention is simply used to assemble the heat pipe and the board body without performing CNC cutting process and soldering process, so that the labor cost and the process cost may be reduced. Moreover, since the manufacturing method does not include CNC cutting process and soldering process, the yield rate of the heat dissipation assembly having the heat pipe and the board body may be increased, and the mechanical strength of the heat dissipation assembly may be improved.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A manufacturing method of a heat dissipation assembly comprising:
   (a) forming an accommodating concave portion and a plurality of hollow areas on a board body, wherein the hollow areas are through the board body located in the accommodating concave portion;
   (b) forging the board body located in the accommodating concave portion, such that the board body surrounding the hollow areas is extended to close the hollow areas;
   (c) placing a heat pipe in the accommodating concave portion, wherein a width of the heat pipe and a width of the accommodating concave portion are substantially the same; and
   (d) performing a stamping treatment on the board body surrounding the accommodating concave portion to form a plurality of positioning protruding portions, wherein the positioning protruding portions protrude toward the accommodating concave portion, such that the heat pipe is fixed between the positioning protruding portions and the accommodating concave portion.

2. The manufacturing method of the heat dissipation assembly of claim 1, further comprising:
   coating a heat conduction glue on the heat pipe or the board body located in the accommodating concave portion, such that the heat conduction glue is between the heat pipe and the board body.

3. The manufacturing method of the heat dissipation assembly of claim 1, further comprising:
   performing a rolling treatment on the heat pipe to flat a surface of the heat pipe and to reduce a thickness of the heat pipe.

4. The manufacturing method of the heat dissipation assembly of claim 1, wherein a thickness of the heat pipe is greater than a depth of the accommodating concave portion, such that the heat pipe is abutted against the positioning protruding portions.

5. The manufacturing method of the heat dissipation assembly of claim 1, wherein step (a) comprises:
   performing a stamping treatment on the board body, such that the accommodating concave portion and the hollow areas are formed in the board body.

6. The manufacturing method of the heat dissipation assembly of claim 1, wherein step (b) is at room temperature in a range from 0 to 40° C.

7. The manufacturing method of the heat dissipation assembly of claim 1, wherein performing the stamping treatment in step (d) is at room temperature in a range from 0 to 40° C.

8. The manufacturing method of the heat dissipation assembly of claim 1, wherein a lengthwise direction of each of the positioning protruding portions is the same as a lengthwise direction of the heat pipe.

9. The manufacturing method of the heat dissipation assembly of claim 1, wherein the board body is made of a material comprising aluminum or copper.

* * * * *